(12) United States Patent
Zhao et al.

(10) Patent No.: US 6,245,684 B1
(45) Date of Patent: *Jun. 12, 2001

(54) METHOD OF OBTAINING A ROUNDED TOP TRENCH CORNER FOR SEMICONDUCTOR TRENCH ETCH APPLICATIONS

(75) Inventors: Ganming Zhao, Fukushima (JP); Jeffrey D. Chinn, Foster City, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/042,249

(22) Filed: Mar. 13, 1998

(51) Int. Cl.[7] .................................. H01L 21/302

(52) U.S. Cl. .................. 438/704; 438/710; 438/706; 438/745; 438/733

(58) Field of Search .................. 438/700, 697, 438/701, 702, 704, 706, 745, 710, 733

(56) References Cited

U.S. PATENT DOCUMENTS

| 5,013,680 |   | 5/1991  | Lowrey et al. ............. 437/52 |
|-----------|---|---------|------------------------------------|
| 5,186,718 |   | 2/1993  | Tepman et al. ............ 29/25.01 |
| 5,236,868 |   | 8/1993  | Nulman ..................... 437/190 |
| 5,320,728 |   | 6/1994  | Tepman ..................... 204/192 |
| 5,554,564 | * | 9/1996  | Nishioka et al. ........... 437/192 |
| 5,635,423 | * | 6/1997  | Huang et al. .............. 437/195 |
| 5,668,039 | * | 9/1997  | Lin .......................... 438/387 |
| 5,674,775 | * | 10/1997 | Ho et al. .................... 437/67 |
| 5,906,861 | * | 5/1999  | Mack et al. ................ 427/255.3 |

OTHER PUBLICATIONS

"Silicon Processing for the VLSI Era", vol. 1, Wolf, S., and Tauber, R.N. pp. 522,531,546, 1986.*

* cited by examiner

Primary Examiner—Benjamin L. Utech
Assistant Examiner—Vanessa Perez-Ramos
(74) Attorney, Agent, or Firm—Shirley L. Church (57) ABSTRACT

The present disclosure pertains to our discovery that a particular sequence of processing steps will lead to the formation of a rounded top corner on a trench formed in a semiconductor substrate. In general, the method of the invention includes the following steps: (a) providing a film stack comprising the following layers, from the upper surface of the film stack toward the underlying substrate, (i) a first layer of patterned material which is resistant to a wet etch solution used to etch an underlying second layer and which is resistant to dry etch components used to etch the semiconductor substrate, and (ii) a second layer of material which can be preferentially etched using a wet etch solution, wherein the second layer of material is deposited directly on top of the semiconductor substrate; (b) wet etching the second layer by immersing the film stack in a wet etch solution for a period of time sufficient to form an undercut beneath the first layer and to expose the underlying semiconductor substrate; and (c) isotropically dry etching the exposed semiconductor substrate so as to form a trench in the semiconductor substrate. The present invention provides a method for obtaining a rounded top trench corner while at the same time retaining excellent control of the critical dimensions of the trench. The method of the invention, which is useful in both shallow trench and vertical trench applications, provides a rounded top trench corner having a radius within the range of about 150 Å to about 500 Å, most preferably, within the range of about 200 Å to about 350 Å.

38 Claims, 4 Drawing Sheets

METHOD OF OBTAINING A ROUNDED TOP TRENCH CORNER FOR SEMICONDUCTOR TRENCH ETCH APPLICATIONS

BACKGROUND OF THE INVENTION

1. Field of the Invention

The present invention pertains to a method of obtaining a rounded top corner on a trench formed in a semiconductor substrate.

2. Brief Description of the Background Art

Trenches formed in silicon using traditional etching methods typically have sharp, squared-off top corners. These sharp, squared-off corners lead to high field stress in film layers subsequently deposited thereon during further processing steps. The high field stress can potentially lead to the breakdown of the deposited film layers. The sharp, squared-off corners are a point of charge accumulation, which can cause the charge to pass through the insulating (dielectric) material, resulting in eventual device failure. As such, rounding of the top trench corner can be critical for device performance, particularly over the long term.

A prior art method for "rounding" the top corners in shallow silicon trench applications is shown in FIG. 1. In the method illustrated in FIG. 1, a film stack 2 comprising a patterned layer 8 of photoresist, a layer 6 of silicon nitride, and a layer 4 of silicon dioxide is deposited (from top to bottom) on a silicon substrate 10. As shown in FIG. 1A, the film stack 2 is first isotropically dry etched to form a trench 12 in the silicon substrate 10.

Figure 1A:
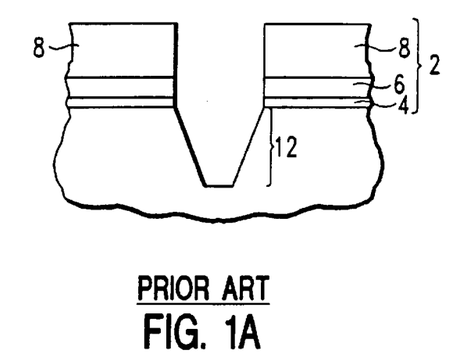
FIGS. 1A–1C show a prior art method for obtaining a rounded top trench corner in shallow silicon trench applications.
Figure 1B:
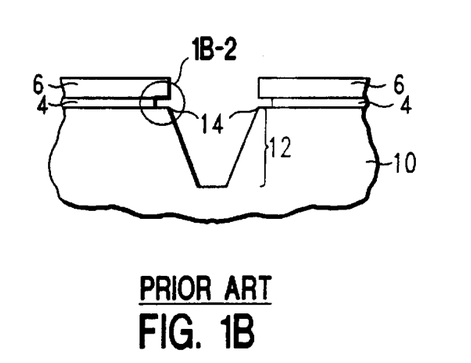
Figure 1B:
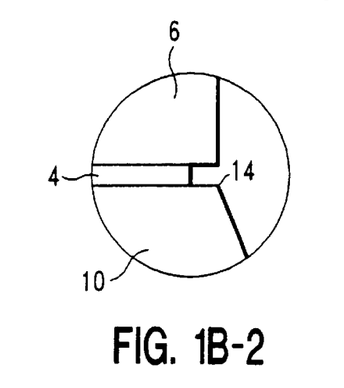

The film stack is then wet etched using a conventional wet etch solution (such as hydrogen fluoride, ammonium fluoride, or a buffered oxide etch solution) to undercut the silicon dioxide layer 4 and expose the sharp top corners 14 of the silicon trench 12, as shown in FIG. 1B. FIG. 1B–2 is an enlarged view of a top corner 14 of silicon trench 12.

Figure 1C:
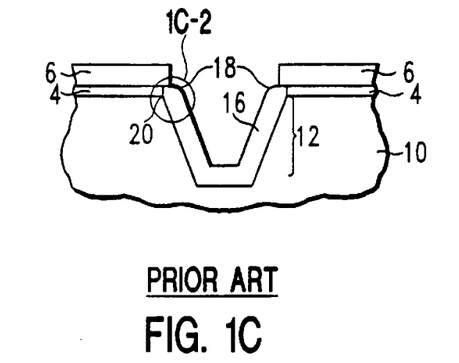

A secondary oxide layer 16 is then formed by introducing oxygen into the processing chamber, where it reacts with exposed silicon substrate to form a layer of silicon dioxide lining the trench. As shown in FIG. 1C, the top trench corners 18 formed by growth of the secondary oxide layer 16 are rounded. However, although the silicon dioxide corner is rounded, there is still an underlying corner 20 on the silicon surface which can serve as a point of charge accumulation and, ultimately, device failure.

Therefore, as described above, this prior art method does not succeed in sufficiently rounding the top corners of the silicon trench. In addition, there are other disadvantages to this method. For example, during the formation of the secondary oxide layer 16, some of the silicon substrate material 10 is consumed and converted to silicon dioxide. This leads to alteration of the critical dimensions (i.e., feature size) of the trench. Also, thick shoulders of silicon dioxide may build up on the field surface and top sidewalls of the trench as a result of forming the secondary oxide layer. These thick shoulders can result in void formation during subsequent filling of the trench.

Therefore, a method of obtaining a rounded top corner on a trench formed in a semiconductor substrate which does not alter the critical dimensions of the trench and does not interfere with subsequent filling of the trench would be highly advantageous. It would also be desirable to provide a method of obtaining a rounded top corner on a semiconductor trench that can be used for both shallow trench and vertical trench applications.

SUMMARY OF THE INVENTION

Applicants have discovered a novel method of obtaining a rounded top corner on a trench formed in a semiconductor substrate.

It is an object of this invention to provide a method of obtaining a rounded top corner on a semiconductor trench without altering the critical dimensions of the trench.

It is another object of this invention to provide a method of obtaining a rounded top corner on a semiconductor trench which does not interfere with subsequent processing steps.

It is another object of this invention to provide a method of obtaining a rounded top corner on a semiconductor trench which yields a device having a higher breakdown voltage as compared to prior art trenches.

It is a further object of this invention to provide a method of obtaining a rounded top corner on a semiconductor trench which is useful for both shallow trench applications (e.g., for capacitors) and vertical trench applications (e.g., for vertical transistors or DRAMs).

Accordingly, disclosed herein is a method of obtaining a rounded top corner on a trench formed in a semiconductor substrate. The general method comprises the following steps: (a) providing a film stack comprising the following layers, from the upper surface of the film stack toward the underlying substrate, (i) a first layer of patterned material which is resistant to a wet etch solution used to etch an underlying second layer and which is resistant to dry etch components used to etch the semiconductor substrate, and (ii) a second layer of material which can be preferentially etched using a wet etch solution, wherein the second layer of material is deposited directly on top of the semiconductor substrate; (b) wet etching the second layer by immersing the film stack in a wet etch solution for a period of time sufficient to form an undercut beneath the first layer and to expose the underlying semiconductor substrate; and (c) isotropically dry etching the exposed semiconductor substrate so as to form a trench in the semiconductor substrate.

A preferred method of the invention comprises the following steps: (a) providing a film stack comprising the following layers on a silicon substrate, from the upper surface of the film stack toward the underlying silicon substrate, (i) a patterned layer of photoresist, (ii) a patterned layer of silicon nitride, and (iii) a layer of silicon dioxide, wherein the layer of silicon dioxide is deposited directly on top of the silicon substrate; (b) wet etching the layer of silicon dioxide by immersing the film stack in a wet etch solution comprising an oxygen-selective liquid reagent for a period of time sufficient to form an undercut beneath the silicon nitride layer and to expose the underlying silicon substrate; and (c) isotropically dry etching the exposed silicon substrate so as to form a trench in the silicon substrate.

A particularly preferred method of the invention comprises the following steps: (a) providing a film stack comprising the following layers on a silicon substrate, from the upper surface of the film stack toward the underlying silicon substrate, (i) a patterned layer of photoresist, (ii) a patterned layer of silicon nitride, and (iii) a layer of silicon dioxide, wherein the layer of silicon dioxide is deposited directly on top of the silicon substrate; (b) wet etching the layer of silicon dioxide by immersing the film stack in a wet etch solution comprising an oxygen-selective liquid reagent for a period of time sufficient to form an undercut beneath the silicon nitride layer, wherein the process of wet etching is stopped prior to exposure of the underlying silicon substrate; (c) isotropically dry etching the layer of silicon dioxide using an oxygen-selective gaseous reagent for a period of time sufficient to complete the etching of the silicon dioxide layer and to expose the underlying silicon substrate; and (d) dry etching the exposed silicon substrate so as to form a trench in the silicon substrate.

An alternative, less preferred method of the invention comprises the following steps: (a) providing a film stack comprising the following layers on a silicon substrate, from the upper surface of the film stack toward the underlying silicon substrate, (i) a patterned layer of photoresist, (ii) a layer of silicon nitride, and (iii) a layer of silicon dioxide, wherein the layer of silicon dioxide is deposited directly on top of the silicon substrate; (b) dry etching the entire film stack using dry etch techniques so as to form a trench in the silicon substrate; (c) wet etching the layer of silicon dioxide by immersing the film stack in a wet etch solution comprising an oxygen-selective liquid reagent for a period of time sufficient to form an undercut beneath the silicon nitride layer and to expose a portion of the underlying silicon substrate; and (d) isotropically dry etching the exposed portion of silicon substrate in order to round the corners of the silicon.

The trench top corner obtained using any of the above variations on the method of the invention preferably has a radius within the range of about 150 Å to about 500 Å, most preferably, within the range of about 200 Å to about 350 Å.

DETAILED DESCRIPTION OF THE INVENTION

The present invention pertains to a method of obtaining a rounded top corner on a trench formed in a semiconductor substrate. In particular, applicants have discovered a particular sequence of processing steps which enable the formation of a rounded top corner on a trench formed in a semiconductor substrate. The method of the invention is useful for both shallow trench and vertical trench applications.

I. DEFINITIONS

As a preface to the detailed description, it should be noted that, as used in this specification and the appended claims, the singular forms "a", "an", and "the" include plural referents, unless the context clearly dictates otherwise.

Specific terminology of particular importance to the description of the present invention is defined below.

The term "aspect ratio" refers to the ratio of the height dimension to the width dimension of particular openings into which an electrical contact is to be placed. For example, a via opening which typically extends in a tubular form through multiple layers has a height and a diameter, and the aspect ratio would be the height of the tubular divided by the diameter. The aspect ratio of a trench would be the height of the trench divided by the minimal travel width of the trench at its base.

The terms "deep trench" and "vertical trench" refer to trenches having an aspect ratio greater than 2:1.

The term "dry etching" refers to etching using a gaseous (rather than liquid) reagent.

The term "feature" refers to contacts, vias, trenches, and other structures which make up the topography of the substrate surface.

The term "feature size" typically refers to the smallest dimension of a feature (i.e., the shortest distance between the sidewalls of a feature).

The terms "horizontal trench" and "shallow trench" refer to trenches having an aspect ratio of 2:1 or less.

The term "oxygen-selective gaseous reagent" refers to a gaseous reagent which preferentially reacts with oxygen, rather than, for example, silicon or nitrogen.

The term "oxygen-selective liquid reagent" refers to a liquid reagent which preferentially reacts with oxygen, rather than, for example, silicon or nitrogen.

The term "polysilicon" refers to polycrystalline silicon.

Figure 5:
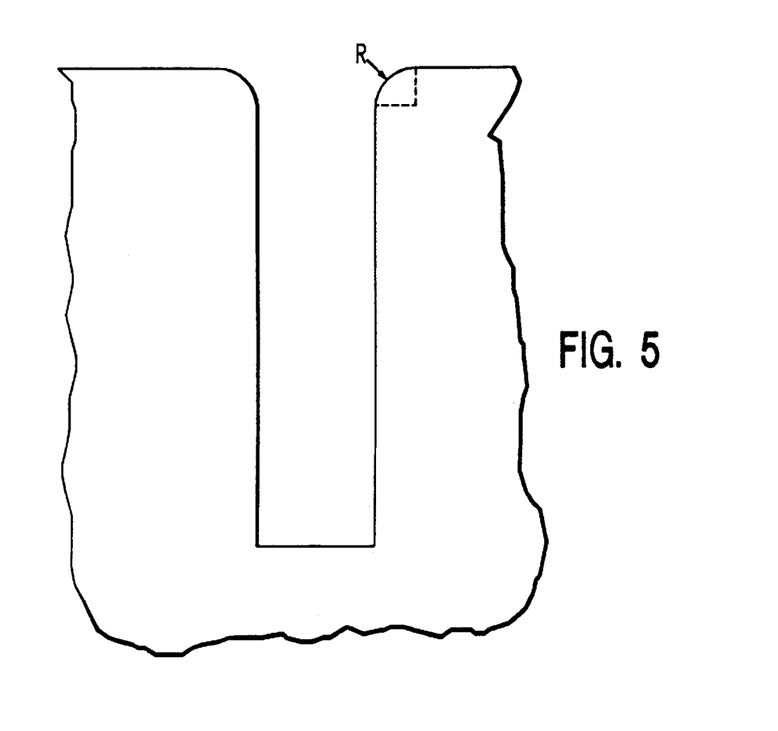
FIG. 5 shows a radius of a top corner of a silicon trench.

The term "radius" refers to the radius of an arc formed at the rounded top corner of a trench, as shown in FIG. 5.

The term "top trench corner" refers to the junction of the top surface of a substrate and a sidewall of a trench formed in the substrate.

The term "wet etching" refers to etching using a liquid reagent.

II. THE METHOD OF OBTAINING A ROUNDED TOP CORNER ON A TRENCH FORMED IN A SEMICONDUCTOR SUBSTRATE

In general, the method of the invention comprises the following steps:

(a) providing a film stack comprising the following layers, from the upper surface of the film stack toward the underlying substrate, (i) a first layer of patterned material which is resistant to a wet etch solution used to etch an underlying second layer and which is resistant to dry etch components used to etch the semiconductor substrate, and (ii) a second layer of material which can be preferentially etched using a wet etch solution, wherein the second layer of material is deposited directly on top of the semiconductor substrate;

(b) wet etching the second layer by immersing the film stack in a wet etch solution for a period of time sufficient to form an undercut beneath the first layer and to expose the underlying semiconductor substrate; and (c) isotropically dry etching the exposed semiconductor substrate so as to form a trench in the semiconductor substrate.

The semiconductor substrate can comprise any semiconductor material, for example, silicon, gallium arsenide, indium phosphide, aluminum phosphide, gallium indium phosphide, germanium, and cadmium telluride, but is preferably silicon.

The first layer material must be different from both the substrate material and the second layer material. The first layer can comprise any material which is capable of being patterned and which is resistant to the wet etch solution used to etch the underlying second layer material and resistant to dry etch components used to etch the semiconductor substrate. For example, the first layer material can be photoresist or BPSG (boron phosphate silicate glass). When photoresist is used as the first layer material, the thickness of the photoresist layer is typically within the range of about 5000 Å to about 2 µm; preferably, about 7500 Å0 to about 1.2 µm; most preferably, about 1 µm. When BPSG is used as the first layer material, the thickness of the BPSG layer is typically within the range of about 2000 Å to about 6000 Å, preferably, about 3000 Å to about 4000 Å.

The second layer, which is deposited directly on top of the semiconductor substrate, can comprise any material which is capable of being etched using a wet etch solution, for example, silicon dioxide, titanium dioxide, silicon oxynitride, TEOS (tetra-ethyl-ortho silicate), and BSG (boron silicate glass). The thickness of the second layer of material is typically within the range of about 90 Å to about 500 Å, most preferably, about 200 Å to about 300 Å.

For example, the first layer may be BPSG, and the second layer TEOS. Or, the first layer may be BPSG, and the second layer BSG.

The film stack can further include an additional layer of material between the first layer of material and the second layer of material. The additional layer of material must be patterned, must be resistant to the wet etch solution used to etch the second layer material, and must also be resistant to dry etch components used to etch the semiconductor substrate. For example, if the second layer material is silicon dioxide, the additional layer may be, for example, patterned silicon nitride or silicon oxynitride. If the second layer material is titanium dioxide, the additional layer may be patterned titanium nitride. The thickness of the additional layer of material is typically within the range of about 800 Å to about 2500 Å, most preferably, within the range of about 1200 Å to about 2000 Å.

The method of the invention is described in detail below with respect to the preferred embodiments.

A preferred method of the invention comprises the following steps:
(a) providing a film stack comprising the following layers on a silicon substrate, from the upper surface of the film stack toward the underlying silicon substrate
  (i) a patterned layer of photoresist,
  (ii) a patterned layer of silicon nitride, and
  (iii) a layer of silicon dioxide, wherein the layer of silicon dioxide is deposited directly on top of the silicon substrate;
(b) wet etching the layer of silicon dioxide by immersing the film stack in a wet etch solution comprising an oxygen-selective liquid reagent for a period of time sufficient to form an undercut beneath the silicon nitride layer and to expose the underlying silicon substrate; and
(c) isotropically dry etching the silicon substrate so as to form a trench in the exposed silicon substrate.

Figure 2A:
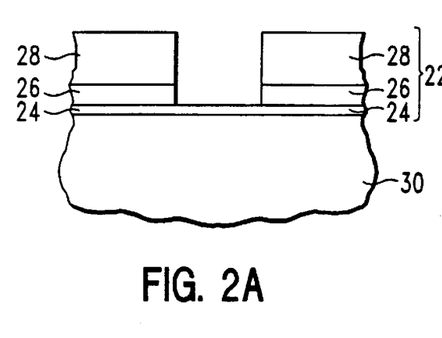
FIGS. 2A–2D show a first embodiment of the method of the invention.

Referring to FIG. 2A, a film stack 22 is provided on the surface of silicon substrate 30 which includes, from the upper surface of the film stack toward the underlying silicon substrate: (i) a patterned layer of photoresist 28, (ii) a patterned layer of silicon nitride 26, and (iii) a layer of silicon dioxide 24 (Note: The thicknesses of the film layers shown in FIGS. 1–4 are not to scale. Some of the layers are drawn disproportionately thick in order to show detail.)

The various layers of the film stack can be formed using any of the conventional methods for deposition of film layers, including but not limited to chemical vapor deposition (CVD) and physical vapor deposition (PVD), including traditional sputter deposition and ion sputter deposition. The traditional sputter deposition process is well known in the art. The ion sputter deposition method is described by S. M. Rossnagel and J. Hopwood in their papers "Metal ion deposition from ionized magnetron sputtering discharge", *J. Vac. Sci. Technol. B*, Vol. 12, No. 1 (Jan/Feb 1994) and "Thin, high atomic weight refractory film deposition for diffusion barrier, adhesion layer, and seed layer applications", *J. Vac. Sci. Technol. B*, Vol. 14, No. 3 (May/Jun 1996).

Deposition of film layers may be carried out using the Applied Materials, Inc. (Santa Clara, Calif.) Endura® Integrated Processing System. The system is shown and described in U.S. Pat. No. 5,186,718 and 5,236,868, the disclosures of which are hereby incorporated by reference herein in their entireties.

The photoresist layer can comprise any suitable photoresist material known in the art. For example, the photoresist may be deep UV or I-line. The thickness of the photoresist layer will typically be within the range of about 5000 Å to about 2 $\mu$m; preferably, about 7500 Å to about 1.2 $\mu$m; most preferably, about 1 $\mu$m. Patterning of the photoresist layer will depend on the particular photoresist material used and should be performed according to the photoresist manufacturer's instructions.

The silicon nitride layer is preferably patterned by dry etching. In order to maintain good control over the critical feature dimensions of the trench, dry etching of the silicon nitride layer is preferably anisotropic. The silicon nitride can be dry etched using any suitable oxide etch chemistry, including but not limited to, $CHF_3$, $CF_4$, $CHF_3O_2$, $CHF_3CF_4$, and $CHF_3CH_3F$.

Dry etching may be carried out using, for example, the Applied Materials, Inc. MxP™ series or MxP+™ series etch processing chambers.

Figure 2B:
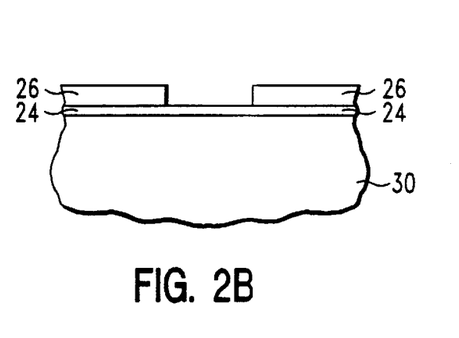

The photoresist layer can optionally be removed at this point, as shown in FIG. 2B. Removal of the photoresist layer may be carried out using, for example, the Applied Materials, Inc. ASP+™ advanced strip and passivation chamber.

Dry etching and removal of the photoresist layer may be carried out using a multi-chamber processing system, such as the Applied Materials, Inc. Metal Etch DPS R1 Centura® Integrated Processing System.

The silicon dioxide layer (also known as the "pad oxide" layer) is then wet etched by immersing the film stack in a wet etch solution comprising an oxygen-selective liquid reagent for a period of time sufficient to undercut the silicon dioxide layer beneath the silicon nitride layer and expose underlying silicon substrate. Preferably, wet etching of the silicon dioxide layer is performed by immersing the film stack in a wet etch solution comprising fluorine. The wet etch solution preferably comprises hydrogen fluoride, but alternatively may comprise another type of fluoride, such as ammonium fluoride. If the photoresist layer has not been removed, a buffered oxide etch solution should be used for this processing step.

The period of time during which the film stack must be immersed in the wet etch solution in order for the silicon dioxide layer to be sufficiently etched to provide an undercut beneath the silicon nitride layer is dependent upon a variety of factors, including the composition and concentration of the wet etch solution used. Most importantly, however, the period of time required to provide the undercut is dependent upon the thickness of the silicon dioxide layer (i.e., a thicker silicon dioxide layer will require a longer wet etch period than will a thinner layer) and the amount of undercutting desired. Preferably, the silicon dioxide layer has a thickness within the range of about 90 Å to about 500 Å, most preferably, about 200 Å to about 300 Å. Typically, the silicon dioxide layer should be undercut beneath the silicon nitride layer by at least the target radius, which is within the range of about 150 Å to about 500 Å, most preferably, within the range of about 200 Å to about 350 Å; therefore, the silicon dioxide layer should be etched back beneath the silicon nitride layer at least about 300 Å to about 500 Å. Typical wet etch solutions will etch silicon dioxide at a rate of about 500–1000 Å per minute. Therefore, immersion of the film stack in the wet etch solution for as little as 10–15 seconds will in many cases be sufficient to adequately etch the silicon dioxide layer.

Care must be taken not to etch the silicon dioxide layer too little or too much. If the silicon dioxide layer is insufficiently etched, the resulting top trench corner on the semiconductor substrate will not be rounded enough. If the silicon dioxide layer is etched back too far, the corner could become too rounded. The timing of the wet etch step must also be carefully controlled to avoid removing the silicon dioxide layer entirely when the spacing between features is particularly close.

Figure 2C:
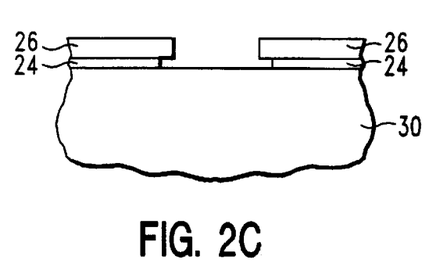

Etching of the silicon dioxide layer 24 to undercut silicon nitride layer 26 is illustrated in FIG. 2C. What will eventually become the rounded top corner of a silicon trench is exposed during the silicon dioxide wet etch step.

The silicon substrate is then dry etched isotropically to form a trench 32. The silicon is preferably dry etched using a gas selected from $NF_3$, HBr, He, $O_2$, and combinations thereof. Dry etching may be carried out using the Applied Materials, Inc. Centura® Integrated Processing System.

Table 1, below, provides typical conditions for submicron deep trench dry etch using a standard 200 mm (8 inch) silicon wafer.

TABLE 1

Typical Conditions for Submicron Deep Trench Dry Etch

| | |
|---|---|
| HBr (sccm) | 55–65 |
| He/$O_2$ (sccm) | 15 |
| $NF_3$ (sccm) | 17 |
| Process chamber pressure (mT) | 100 |
| Power (W) | 800 |
| Magnetic field (G) | 50 |
| Time (sec) | depth-dependent |
| He back pressure | 8 Torr* |
| Cathode temperature (support platen) | 18° C. |
| Process chamber wall temperature | 45–50° C. |

*Results in a typical helium leak rate of about 0–5 sccm.

The portion of silicon exposed during the wet etch step is subject to rounding during this isotropic etch step, while the trench profile is defined by the photoresist/silicon nitride mask due to a shadowing effect. The sheltered portion of the silicon substrate is protected from bombardment by ions during the trench formation step.

Figure 1C:
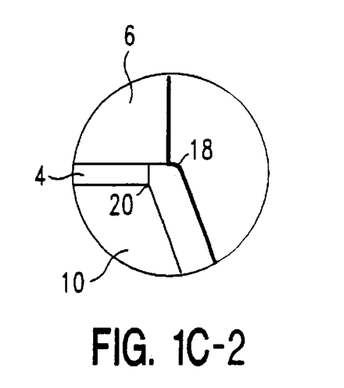
Figure 2D:
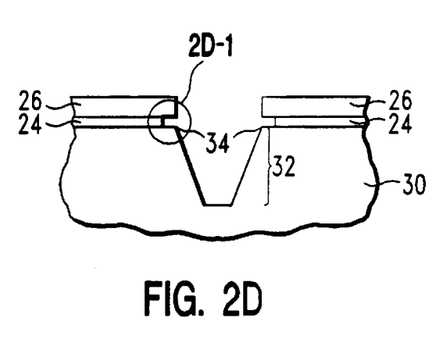
Figure 2D:
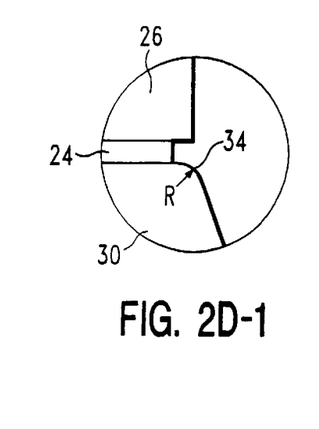

FIG. 2D shows a trench 32 with rounded top corners 34 formed in a silicon substrate 30 by following the method of the invention. FIG. 2D–1 is an enlarged view of a rounded top corner 34 of silicon trench 32, which can be compared with the angular top trench corner obtained when the prior art method is used, as depicted in FIG. 1C–2.

A more preferred embodiment of the method of the invention is shown in FIG. 3. Referring to FIG. 3A, a film stack 42 is provided on a silicon substrate 50 in the following order, from the upper surface of the film stack toward the underlying silicon substrate: (i) a patterned layer of photoresist 48, (ii) a patterned layer of silicon nitride 46, and (iii) a layer of silicon dioxide 44, according to the method described above.

Figure 3A:
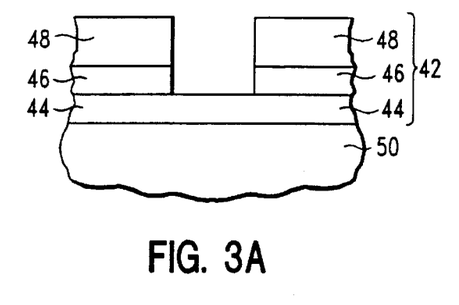
FIGS. 3A–3E show a second, more preferred embodiment of the method of the invention.
Figure 3B:
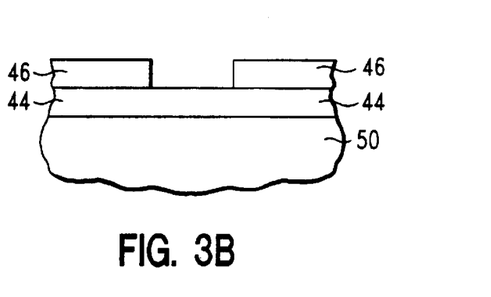

The photoresist layer can optionally be removed at this point, as described above and shown in FIG. 3B.

Figure 3C:
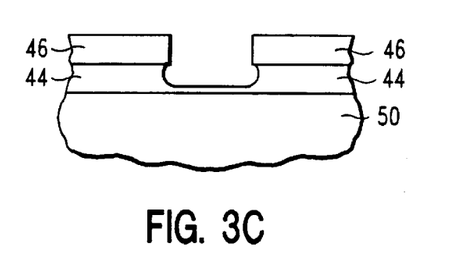

The silicon dioxide layer is then wet etched by immersing the film stack in a wet etch solution comprising the oxygen-selective liquid reagent as previously described. In the more preferred embodiment of the invention, the wet etch step is stopped prior to breaking through to the underlying silicon substrate, as shown in FIG. 3C. Because the wet etch step is not allowed to proceed to completion (i.e., breakthrough to the underlying silicon substrate), the duration of the wet etch step will necessarily be slightly shorter than described above with reference to the first embodiment of the invention.

Figure 3D:
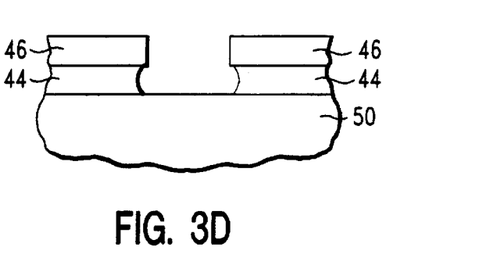

The wet etch step is preferably followed by a breakthrough step in which the residual layer of silicon dioxide is isotropically dry etched using an oxygen-selective gaseous reagent for a period of time sufficient to complete the etching of the silicon dioxide layer and expose the underlying silicon substrate, as shown in FIG. 3D. This dry etch at the base of the silicon dioxide layer provides careful control over the profile of the silicon dioxide layer near the silicon top corner which is to be rounded. The oxygen-selective gaseous reagent may be any gaseous silicon etchant, but preferably comprises chlorine in combination with an inert gas, such as argon. Alternatively, the oxygen-selective gaseous reagent may comprise one or more of the following gases: argon, HBr/argon, $CF_4$ with oxygen, or $CHF_3$ with oxygen.

Figure 3E:
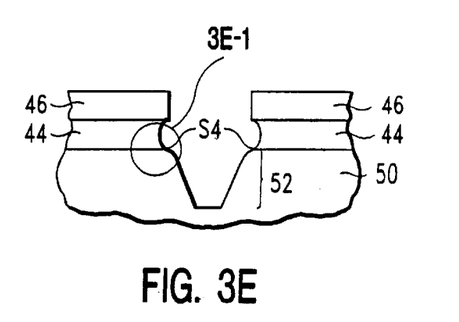

The silicon substrate is then dry etched as described above to form a trench 52 in the silicon substrate while rounding the silicon trench top corner, as illustrated in FIG. 3E. Because the breakthrough and trench etching steps are performed separately, isotropic etching may be used for corner rounding during the breakthrough step, and anisotropic etching may be used for the trench etch step. As such, this embodiment of the method of the invention is particularly preferred for etching deep, vertical trenches. Alternatively, isotropic etching can be used for the trench etch step if a shallow trench is desired.

Figure 3E:
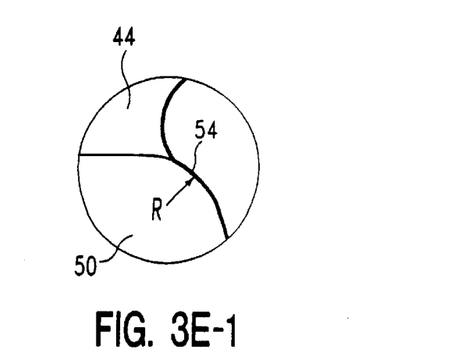

FIG. 3E–1 is an enlarged view of a rounded top corner 54 of a shallow silicon trench 52 which is obtained using the most preferred method of the invention.

In an alternative, less preferred method of the invention, a trench is etched in the silicon substrate prior to rounding of the trench top corner. This method comprises the following steps:

(a) providing a film stack comprising the following layers on a silicon substrate, from the upper surface of the film stack toward the underlying silicon substrate
   (i) a patterned layer of photoresist,
   (ii) a layer of silicon nitride, and
   (iii) a layer of silicon dioxide, wherein the layer of silicon dioxide is deposited directly on top of the silicon substrate;

(b) dry etching the entire film stack using dry etch techniques so as to form a trench in the silicon substrate;

(c) wet etching the layer of silicon dioxide by immersing the film stack in a wet etch solution comprising an oxygen-selective liquid reagent for a period of time sufficient to form an undercut beneath the silicon nitriide layer and to expose a portion of the underlying silicon substrate; and (d) isotropically dry etching the exposed portion of silicon substrate in order to round the corners of the silicon.

Figure 4A:
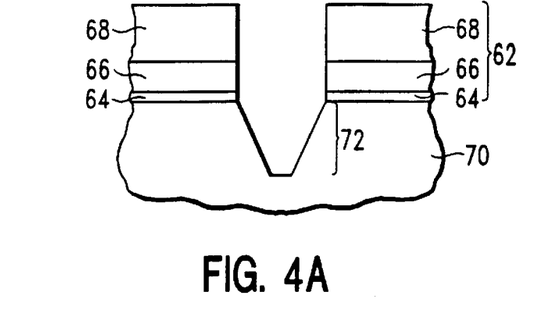
FIGS. 4A–4C show a third embodiment of the method of the invention.

Referring to FIG. 4A, a film stack 62 is provided on a silicon substrate 70 in the following order, from the top of the film stack toward the underlying silicon substrate: (i) a patterned layer of photoresist 68, (ii) a layer of silicon nitride 66 (which may or may not be previously patterned), and (iii) layer of silicon dioxide 64. The film stack may be formed using the kinds of techniques previously described herein.

The entire film stack is then dry etched to form a trench 72 in the silicon substrate 70, using etching methods and apparatus including but not limited to those described above.

Figure 4B:
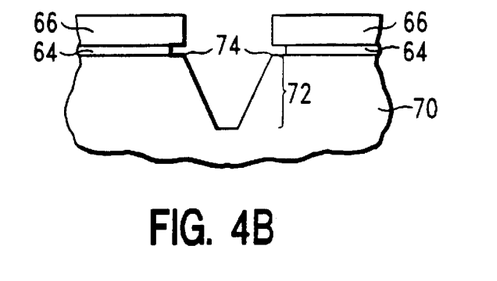

After the trench has been etched in the silicon substrate, the silicon dioxide layer 64 is wet etched as described above in order to form an undercut beneath the silicon nitride layer 66 and to expose the top corners 74 of the trench. Etching of the silicon dioxide layer 64 to undercut the silicon nitride layer 66 is illustrated in FIG. 4B.

Figure 4C:
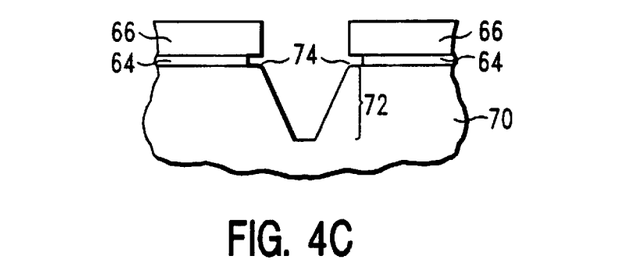

As shown in FIG. 4C, the trench top corners 74 that were exposed by the wet etch step are then isotropically dry etched in order to round the top trench corners, as described above. The trench top corners are preferably etched using the same gases used during the trench formation step, preferably, NF$_3$, HBr, He, O$_2$, and combinations thereof The method of the invention provides a rounded top trench corner having a radius within the range of about 150 Å to about 500 Å, most preferably, within the range of about 200 Å to about 350 °. The top trench corner radius, R, is measured as shown in FIG. 5.

After performing any of the alternative methods of the invention described above, subsequent processing steps may be performed, such as trench filling with, for example, silicon dioxide (e.g., for isolation trenches) or polysilicon (e.g., for transistors).

In summary, the present invention provides a method for obtaining a rounded top trench corner while at the same time retaining excellent control of the critical dimensions of the trench. In addition, the present invention provides a method of obtaining a rounded top trench corner which does not interfere with subsequent processing steps and provides a device which is expected to have a longer functional lifetime than devices formed using prior art trench formation methods. By rounding the top trench corners according to the method of the invention, the breakdown voltage of a device can be increased from a typical breakdown voltage of approximately 9–10 V to about 17 V.

Unlike prior art processes, the method of the present invention is useful for both shallow trench applications (e.g., for capacitors) and vertical trench applications (e.g., for vertical transistors or DRAMs) having aspect ratios as high as, for example, 30:1.

The above described preferred embodiments are not intended to limit the scope of the present invention, as one skilled in the art can, in view of the present disclosure, expand such embodiments to correspond with the subject matter of the invention claimed below.

We claim:

1. A method of obtaining a rounded top corner on a trench formed in a semiconductor substrate, comprising the steps of:
   (a) providing a film stack comprising the following layers on said semiconductor substrate, from the upper surface of said film stack toward said underlying semiconductor substrate
      (i) a first layer of patterned material which is resistant to a wet etch solution used to etch an underlying second layer and which is resistant to dry etch components used to etch said semiconductor substrate, and
      (ii) an underlying second layer of material which can be preferentially etched using said wet etch solution, wherein said second layer of material is deposited directly on top of said semiconductor substrate;
   (b) wet etching said second layer to form an undercut beneath said first patterned layer and to expose said semiconductor substrate; and
   (c) subsequent to step (b) isotropically dry etching at least the upper corners of a trench in said semiconductor substrate.

2. The method of claim 1, wherein said semiconductor substrate comprises silicon.

3. The method of claim 1, wherein said second layer comprises a material selected from the group consisting of silicon dioxide, titanium dioxide, silicon oxynitride, TEOS, and BSG.

4. The method of claim 1, wherein said first layer comprises BPSG, and said second layer comprises a material selected from TEOS and BSG.

5. The method of claim 1, wherein said first layer comprises a patterned photoresist.

6. The method of claim 1, wherein said film stack further comprises an additional layer of material between said first patterned layer and said second layer, wherein said additional layer of material is resistant to said wet etch solution and resistant to dry etch components used to etch said semiconductor substrate, and wherein said method further comprises the additional step of dry etching said additional layer prior to wet etching said second layer.

7. The method of claim 6, wherein said second layer comprises silicon dioxide and said additional layer comprises a material selected from the group consisting of silicon nitride and silicon oxynitride.

8. The method of claim 6, wherein said second layer comprises titanium dioxide and said additional layer comprises titanium nitride.

9. A method of obtaining a rounded top corner on a trench formed in a silicon substrate, comprising the steps of:
   (a) providing a film stack comprising the following layers on a silicon substrate, from the upper surface of the film stack toward said silicon substrate
      (i) a patterned layer of photoresist,
      (ii) a patterned layer of silicon nitride, and
      (iii) a layer of silicon dioxide, wherein said layer of silicon dioxide is directly on top of said silicon substrate;
   (b) wet etching said layer of silicon dioxide to form an undercut beneath said silicon nitride layer and to expose said underlying silicon substrate; and
   (c) subsequent to step (b), isotropically dry etching at least the upper corners of a trench in said silicon substrate.

10. The method of claim 9, wherein said wet etch solution comprises fluorine.

11. The method of claim 10 wherein said wet etch solution comprises hydrogen fluoride.

12. The method of claim 9, wherein said silicon substrate is dry etched using a gas selected from NF$_3$, HBr, He, O$_2$, and combinations thereof.

13. The method of claim 9, wherein the top trench corner obtained using said method has a radius within the range of about 150 Å to about 500 Å.

14. The method of claim 13, wherein the top trench corner obtained using said method has a radius within the range of about 200 Å to about 350 Å.

15. A method of obtaining a rounded top corner on a trench formed in a silicon substrate, comprising the steps of:
   (a) providing a film stack comprising the following layers on a silicon substrate, from the upper surface of the film stack toward the underlying silicon substrate
      (i) a patterned layer of photoresist,
      (ii) a patterned layer of silicon nitride, and
         (iii) a layer of silicon dioxide, wherein said layer of silicon dioxide is directly on top of said silicon substrate;
   (b) wet etching said layer of silicon dioxide by immersing said film stack in a wet etch solution comprising an oxygen-selective liquid reagent for a period of time sufficient to form an undercut beneath said silicon nitride layer, wherein said process of wet etching is stopped prior to exposure of said underlying silicon substrate;

(c) subsequent to step (b), isotropically dry etching said layer of silicon dioxide using an oxygen-selective gaseous reagent for a period of time sufficient to complete the etching of said silicon dioxide layer and to expose said underlying silicon substrate; and (d) subsequent to step (c), dry etching said exposed silicon substrate to form a trench in said silicon substrate.

16. The method of claim 15, wherein said wet etch solution comprises fluorine.

17. The method of claim 16, wherein said wet etch solution comprises hydrogen fluoride.

18. The method of claim 15, wherein said oxygen-selective gaseous reagent comprises chlorine and an inert gas.

19. The method of claim 18, wherein said inert gas comprises argon.

20. The method of claim 15, wherein said silicon substrate is dry etched using a gas selected from $NF_3$, HBr, He, $O_2$ and combinations thereof as a plasma feed gas.

21. The method of claim 15, wherein said trench is formed in said silicon substrate by isotropic etching, and wherein said resulting trench is a shallow trench.

22. The method of claim 15, wherein said trench is formed in said silicon substrate by anisotropic etching, and wherein said resulting trench is a vertical trench.

23. The method of claim 15, wherein the top trench corner obtained using said method has a radius within the range of about 150 Å to about 500 Å.

24. The method of claim 23, wherein the top trench corner obtained using said method has a radius within the range of about 200 Å to about 350 Å.

25. A method of obtaining a rounded top corner on a trench formed in a silicon substrate, comprising the steps of:

(a) providing a film stack comprising the following layers on a silicon substrate, from the upper surface of the film stack toward the underlying silicon substrate
  (i) a patterned layer of photoresist,
  (ii) a layer of silicon nitride, and
  (iii) a layer of silicon dioxide, wherein said layer of silicon dioxide is directly on top of said silicon substrate;

(b) dry etching the entire film stack using at least one dry etch technique to form a trench in said silicon substrate;

(c) subsequent to step (b), wet etching said layer of silicon dioxide to form an undercut beneath said silicon nitride layer and to expose a portion of said underlying silicon substrate; and (d) subsequent to step (c), isotropically dry etching at least the upper corners of a trench in said silicon substrate.

26. The method of claim 25, wherein said wet etch solution comprises fluorine.

27. The method of claim 26, wherein said wet etch solution comprises hydrogen fluoride.

28. The method of claim 25, wherein said silicon substrate is dry etched using a gas selected from $NF_3$, HBr, He, $O_2$, and combinations thereof.

29. The method of claim 25, wherein said top trench corner obtained using said method has a radius within the range of about 150 Å to about 500 Å.

30. The method of claim 29, wherein said top trench corner obtained using said method has a radius within the range of about 200 Å to about 350 Å.

31. The method of claim 1, wherein said second layer is wet etched by immersing said film stack in a wet etch solution for a period of time sufficient to form said undercut.

32. The method of claim 1, including an additional step (d) subsequent to said step (c), wherein a lower portion of said trench is anisotropically etched to extend said trench into said substrate to a predetermined depth.

33. The method of claim 9, wherein said layer of silicon dioxide is wet etched by immersing said film stack in a wet etch solution comprising an oxygen-selective liquid reagent for a period of time sufficient to form said undercut.

34. The method of claim 25, wherein said layer of silicon dioxide is wet etched by immersing said film stack in a wet etch solution comprising an oxygen-selective liquid reagent for a period of time sufficient to form said undercut.

35. A method of obtaining a rounded top corner on a trench formed in a semiconductor substrate, comprising the use of a wet etch step to form an undercut area between an overlying patterned layer and said semiconductor substrate, followed by use of an isotropic dry etch step to provide at least the rounded top corners on a trench in said substrate.

36. The method of claim 35, wherein said trench was formed prior to said wet etch step and said dry etch step forms rounded corners on said trench.

37. The method of claim 35, wherein said isotropic dry etch step forms both said rounded corners and at least an upper portion of said trench concurrently.

38. The method of claim 37, wherein a lower portion of said trench is formed by an anisotropic dry etch step subsequent to said isotropic dry etch step.

* * * * *